United States Patent [19]

Handa

[11] Patent Number: 4,935,930

[45] Date of Patent: Jun. 19, 1990

[54] LASER LIGHT SOURCE FOR GENERATING BEAM COLLIMATED IN AT LEAST ONE DIRECTION

[75] Inventor: Yuichi Handa, Atsugi, Japan

[73] Assignee: Canon Kabushiki Kaisha, Tokyo, Japan

[21] Appl. No.: 298,357

[22] Filed: Jan. 18, 1989

[30] Foreign Application Priority Data

Jan. 20, 1988 [JP] Japan .................... 63-008239

[51] Int. Cl.$^5$ .................................................. H01S 3/30
[52] U.S. Cl. .................................... 372/7; 350/96.19; 350/96.12
[58] Field of Search ................ 372/96, 102, 7; 350/96.14, 96.19; 307/427, 430

[56] References Cited

U.S. PATENT DOCUMENTS

| | | | |
|---|---|---|---|
| 3,842,289 | 10/1974 | Yariv et al. | 307/430 |
| 3,891,302 | 6/1975 | Dabby et al. | 350/96.19 |
| 3,939,439 | 2/1976 | Fletcher et al. | 350/96.19 |
| 4,039,249 | 8/1977 | Kaminow et al. | 350/96.19 |
| 4,227,769 | 10/1980 | Phillips et al. | 350/96.19 |
| 4,427,260 | 1/1987 | Puech et al. | 307/427 |
| 4,776,661 | 10/1988 | Handa | 350/96.12 |

FOREIGN PATENT DOCUMENTS 60-17727  1/1985  Japan .................... 372/96

Primary Examiner—Léon Scott, Jr.
Attorney, Agent, or Firm—Fitzpatrick, Cella, Harper & Scinto

[57] ABSTRACT

A laser light source comprises, a substrate, a channel waveguide path formed on said substrate and having an active area for generating a laser beam upon reception of energy, so as to constitute a laser resonator, a device for supplying the energy to the active area, a slab waveguide path formed on the substrate, and an extracting structure for extracting the laser beam generated in the channel waveguide path to the slab waveguide path as a beam collimated in one direction.

34 Claims, 9 Drawing Sheets

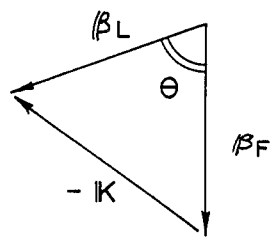
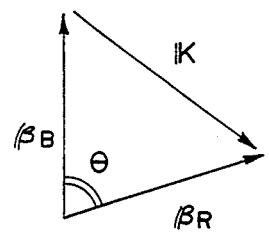
FIG. 5A  FIG. 6A
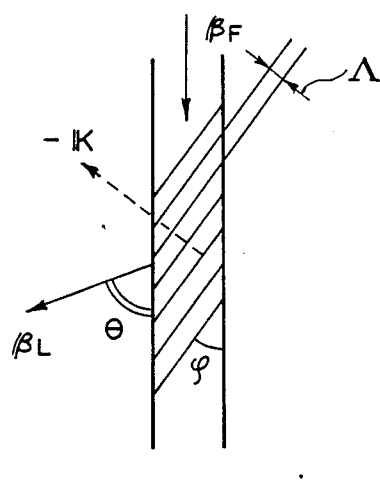
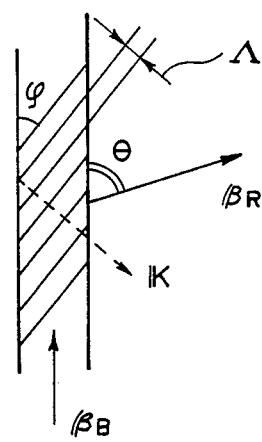
FIG. 5B  FIG. 6B

LASER LIGHT SOURCE FOR GENERATING BEAM COLLIMATED IN AT LEAST ONE DIRECTION

BACKGROUND OF THE INVENTION

1. Field of the Invention

The present invention relates to a laser source and, more particularly, to a laser source suitable for an integrated optical element such as a spectrum analyzer.

2. Related Background Art

A spectrum analyzer has been proposed as an application of an optical integrated circuit. The principle of operation of the spectrum analyzer will be described with reference to FIG. 1. A beam emitted from a semiconductor laser 103 coupled to an end face of a slab waveguide path 101 propagates as a divergent beam 108 along the slab waveguide path 101 and is collimated by a waveguide path lens 104. A collimated beam wave 109 is diffracted by an elastic surface wave 112 excited by an interdigital electrode 106 and is then Fourier-transformed into beam waves 110 and 111 by a waveguide path lens 105. In this manner, the Fourier transformation surface is set to be an end face, and a line sensor such as a CCD sensor is arranged at the end face, so that spectrum analysis of an applied RF (Radio Frequency) signal can be performed. In addition to the above application example, when semiconductor lasers are used in optical integrated circuits in a variety of applications, any beam collimating means such as a waveguide path lens is required in a slab waveguide path. Therefore, fabrication of devices is time-consuming and cumbersome. In addition, it is difficult to produce compact devices which are used in practice.

A linear light source which does not require a collimating means is described as a laser in "Edge-and surface-emitting distributed Bragg reflector laser with multiquantum well active/passive waveguides", K. Kojima et al., Appl. Phys. Lett. 50, 5, PP. 227–229(1987). This laser is a DFB (Distribution Feed-Back) laser which utilizes second-order diffraction as reflection. Part of the optical output is coupled to a first-order diffracted wave and is output in a direction perpendicular to a substrate.

In this example, however, since beam waves bidirectionally propagate in a resonator, two beams having a very small output angle difference are output. When these beams are focused, two beam spots are undesirably formed. In addition, the output direction is perpendicular to the surface of the substrate. When this substrate is coupled to another waveguide path, i.e., another substrate, these substrates must be located adjacent to each other. If these substrates include an LD (Laser Diode) which emits light from the upper surface having electrodes, the composite structure is complicated.

The present inventor proposed structures in Japanese Patent Laid-Open (Kokai) Nos. 62-123411 and 62-124510 (corresponding to U.S. Pat. No. 4,776,661). In these structures, a beam diffracted from a channel waveguide path 124 having a grating 125 shown in FIG. 2 is used as a means for obtaining a collimated slab waveguide beam. A beam wave 126 output from a semiconductor laser 123 coupled to an end face of the channel waveguide path 124 is Bragg-diffracted by the grating 125 having a uniform period. Part of the beam wave 126 is coupled to a slab waveguide beam 127 which propagates along the slab waveguide path. By using the grating having the uniform period, in-phase collimated beams can be produced.

SUMMARY OF THE INVENTION

It is an object of the present invention to further develop the above proposal and to provide a compact, simple laser source for more efficiently producing a collimated beam.

In order to achieve the above object of the present invention, there is provided a laser light source comprising:

a substrate;

a channel waveguide path formed on the substrate, the channel waveguide path having an active area for generating a laser beam upon reception of energy, and the channel waveguide path constituting a laser resonator;

means for supplying the energy to the active area;

a slab waveguide path formed on the substrate; and means for extracting the laser beam generated in the channel waveguide path to the slab waveguide path as a beam collimated in one direction.

BRIEF DESCRIPTION OF THE DRAWINGS

FIGS. 5A to 6B are vector charts of Bragg diffraction by means of a grating;

DETAILED DESCRIPTION OF THE PREFERRED EMBODIMENTS

Preferred embodiments of the present invention will be described with reference to the accompanying drawings.

(First Embodiment)

Figure 3:
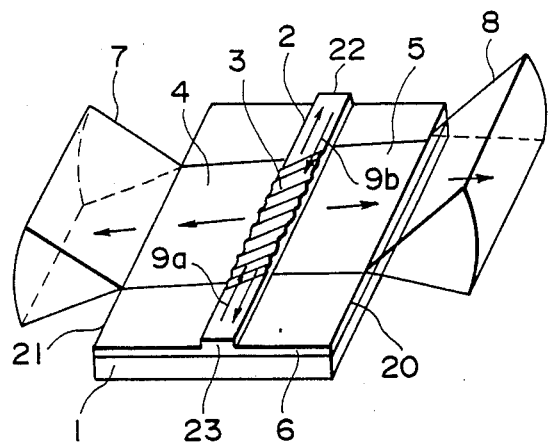
FIGS. 3 and 4 are a schematic perspective view and a sectional view, respectively, showing a semiconductor laser according to a first embodiment of the present invention.
Figure 4:
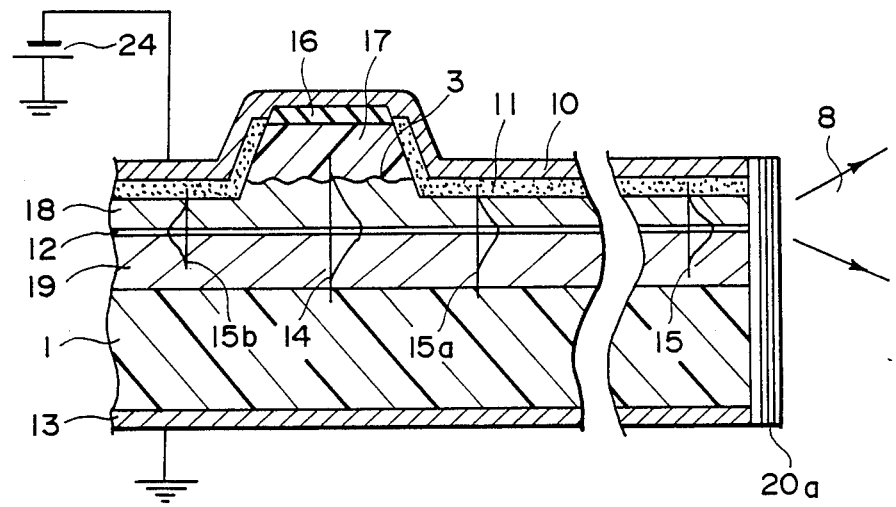

FIG. 3 is a schematic perspective view showing a slab waveguide light output semiconductor laser according to a first embodiment of the present invention, and FIG. 4 is a detailed sectional view of FIG. 3. A detailed waveguide structure and an electrode structure are not illustrated in FIG. 3 and are represented by a channel waveguide path 2 (corresponding to an optical resonator) and a slab waveguide path 6 which is a peripheral element of the channel waveguide path 2. More specifically, a grating 3 and slab waveguide beams 4 and 5 are present under an upper electrode 10 and cannot be actually seen. The illustration as described above will be employed in the subsequent embodiments.

This embodiment employs a ridge type laser structure. The slab waveguide path 6 and the channel waveguide path 2 as a stripe-like projection are formed on a semiconductor substrate 1 such as a GaAs substrate. An insulating layer 11 consisting of $SiN_x$ causes selective current injection from a power source 24 to only a lower portion of the channel waveguide path 2. The channel waveguide path 2 uses end faces 22 and 23 as mirror surfaces perpendicular to its longitudinal direction and constitutes a laser resonator. The grating 3 is obliquely formed on the upper surface of the channel waveguide path 2 such that grating lines have non-zero and non-right angles with respect to the beam propagation direction. Therefore, the laser beams generated in the resonator (i.e., the channel waveguide path 2) are a forward wave 9b and a backward wave 9a. The forward wave 9b is Bragg-reflected by the grating 3 and is coupled to the slab waveguide beam 4 which propagates to the left. The backward wave 9a is coupled to the slab waveguide beam 5 which propagates to the right. The slab waveguide beams 4 and 5 serve as linear light sources at end faces 21 and 20, respectively. Therefore, the slab waveguide beams 4 and 5 become columnar output beams 7 and 8 which are collimated in the horizontal direction and diverged in a direction of thickness of the substrate.

Front and rear end faces 22 and 23 used in the resonator exhibit high reflectances. Dielectric multilayered films 20a (e.g., $Si/SiO_2$ or $Al_2O_3/SiO_2$ film) are respectively formed on the output end faces 21 and 20 so as to satisfy antireflection conditions, thereby achieving high efficiency of the device The end faces 20, 21, 22, and 23 are formed by vertical cleavage or etching of the GaAs crystal. Metal films may be respectively coated on the end faces 22 and 23 to increase their reflectances.

A method of manufacturing the above laser will be described with reference to FIG. 4.

An n-type epitaxial film 19, a GaAlAs active layer 12, and a p-type epitaxial film 18 are sequentially formed on the semiconductor substrate 1 by epitaxial growth. The n-type epitaxial film 19 and the p-type epitaxial film 18 may be deposited by molecular beam epitaxy (MBE), organic metal chemical vapor deposition (MOCVD), or the like. A photoresist is applied to the surface of the p-type epitaxial film 18. The photoresist is exposed by holographic interference, electron beam exposure, or the like and is then developed. The p-type epitaxial film 18 is etched using the photoresist pattern as a mask, thereby forming the grating 3. Thereafter, a p-type epitaxial film 17 and a cap layer 16 are formed on the film 18. A coupling coefficient of the grating 3 can be adjusted by a difference between refractive indices of the p-type epitaxial films 17 and 18. The ridge is formed by etching using photolithographic techniques. Lower and upper electrodes 13 and 10 are formed on the lower surface of the semiconductor substrate 1 and the upper surface of the insulating layer 11, respectively, thereby obtaining a laser structure shown in FIG. 4.

The beam wave is trapped in the lateral direction and the current path is narrowed by the ridge structure. In this state, the laser resonator along the ridge can be operated. The GaAlAs active layer 12, the p-type epitaxial film 18, and the n-type epitaxial film 19 in FIG. 4 correspond to the slab waveguide path 6 in FIG. 3, and output beams 7 and 8 are output from the GaAlAs active layer 12. The slab waveguide beams 4 and 5 are narrowed by the slab waveguide path 6 at both sides of the channel waveguide path 2 (ridge portion) in a direction of thickness of the substrate 1. A beam wave (i.e., a laser oscillated beam) 14 which propagates along the channel waveguide path 2 is radiated and coupled to slab waveguide beams 15a and 15b by the grating 3.

FIGS. 5A, 5B, 6A, and 6B are vector charts showing coupling between the forward and backward waves 9b and 9a of the channel waveguide beams and the slab waveguide beams. Vectors of the forward and backward waves 9b and 9a are represented by $\beta_F$ and $\beta_B$, and propagation constants of the forward and backward waves 9b and 9a are represented by $|\beta_F|$ and $|\beta_B|$, respectively. Conditions $||\beta_F|| = \beta_F$ and $||\beta_B|| = \beta_B$ are established. Vectors of the slab waveguide beams 4 and 5 which propagate to the left and right are represented by $\beta_L$ and $\beta_R$, and propagation constants of the slab waveguide beams 4 and 5 are represented by $|\beta_L|$ and $|\beta_R|$. Conditions $||\beta_L|| = \beta_L$ and $||\beta_R|| = \beta_R$ are established. A tilt angle of the grating, a grating vector, and its magnitude are represented by $\psi$, $|K|$, and $K$, respectively. If the grating period is given as $\Lambda$, condition $K = 2\pi/\Lambda$ is established. In order to obtain high coupling efficiency between the forward wave 9b and the slab waveguide beam 4 and between the backward wave 9a and the slab waveguide beam 5, these vectors must constitute closed loops, as shown in FIGS. 5A and 6A. In other words, these vectors must satisfy the Bragg condition. For example, assume that the deflection output angle $\theta$ of the slab waveguide beam is 45°, a wavelength $\lambda$ is 0.78 $\mu$m, and an equivalent refractive index N of each waveguide path is given. Under these assumptions, if $N = \beta/k = 3.3$ ($k = 2\pi/\lambda$) is established, the grating period $\Lambda$ is obtained from the Bragg condition (i.e., $2\beta \sin(\theta/2) = K$):

$$\Lambda = \lambda/2N \sin \theta/2 = 0.309 \ \mu m)$$

In this case, the tilt angle $\psi$ of the grating is given as $\psi = \theta/2 = 22.5°$. The above grating period $\Lambda$ is obtained when first-order diffraction is used. When second-order diffraction is used, a grating period $\Lambda'$ is given as $\Lambda' = 2\Lambda = 0.618 \ \mu m$. In general, a grating period $\Lambda n$ in nth-order diffraction is given as $\Lambda n = n\Lambda$. In this case, the tilt angle $\psi$ of the grating must be kept unchanged to be $\psi = 22.5°$. As described in this embodiment, when the grating of a uniform period is used, part of the channel waveguide beam from laser oscillation can be efficiently coupled to the slab waveguide path, and the collimated slab waveguide beam can be obtained.

(Second Embodiment)

Figure 7:
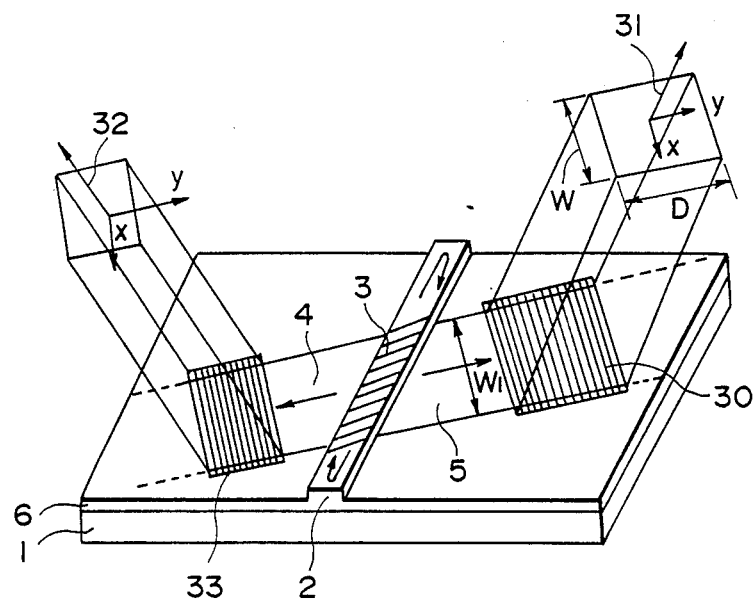
FIG. 7 is a schematic perspective view showing a second embodiment of the present invention.

FIG. 7 is a schematic perspective view showing a second embodiment of the present invention.

This embodiment exemplifies a semiconductor laser wherein gratings 30 and 33 are formed in part of the slab waveguide path 6 of the first embodiment, and slab waveguide beams 5 and 4 are extracted above a semiconductor substrate 1 as laser beams 31 and 32, thereby obtaining a two-dimensional collimated beam. Since the upper surface of the slab waveguide path 6 is covered with a metal electrode, as shown in FIG. 4, a prospective grating region must be etched at the time of formation of the gratings 30 and 33. More specifically, the gratings 30 and 33 may be formed by holographic exposure or photolithographic techniques using electron beam exposure. The output laser beams 31 and 32 are uniform in the widthwise direction (i.e., the x direction in FIG. 7) with the gratings 30 and 33 of uniform modulation but exponentially decrease in the propagation direction (i.e., the y direction in FIG. 7). Therefore, the output laser beams 31 and 32 become nonuniform beams. In order to obtain more uniform beams, modulation (i.e., a change in refractive index or a relief depth) of the gratings 30 and 33 must be optimized by tapering. In this embodiment, a surface emission type laser source can be provided while the nature of the laser having a conventional stripe structure is kept unchanged. A width W of each beam 31 or 32 is defined by a length $W_1$ of the corresponding grating 30 or 33 of the channel waveguide path 2. However, a depth D of each laser beam 31 or 32 is defined by a coupling length of the gratings 30 and 33. Therefore, modulation of the gratings 30 and 33 must be optimized to obtain a desired beam shape.

Figure 8:
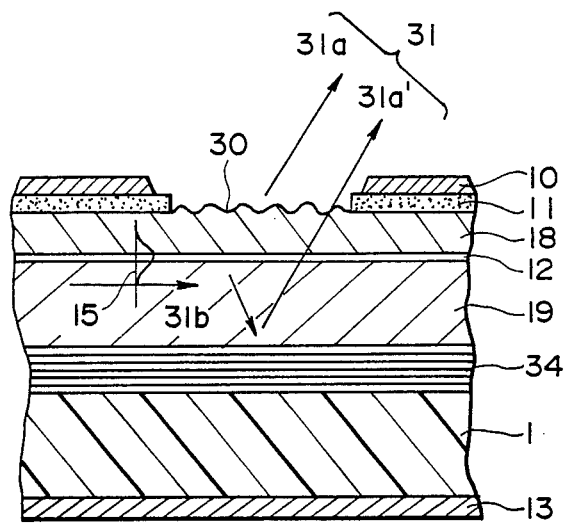
FIG. 8 is a sectional view showing a structure in which a reflecting multilayer is formed on a substrate shown in FIG. 7.

In general, a slab waveguide beam 15 is split into an air-side radiation beam 31a and a substrate-side radiation beam 31b by the grating 30. The substrate-side radiation beam 31b is generally a loss. In order to reduce this loss, a reflecting multilayer 34 consisting of GaAlAs is formed below an active layer 12, as shown in FIG. 8. The substrate-side radiation beam 31b is reflected as a reflected beam 31a' which is superposed in phase with the air-side radiation beam 31a to obtain a superposed laser beam 31. In this case, since these beams are superposed in phase, the thicknesses of the reflecting multilayer 34 and a buffer layer 19 must be adjusted.

(Third Embodiment)

Figure 9:
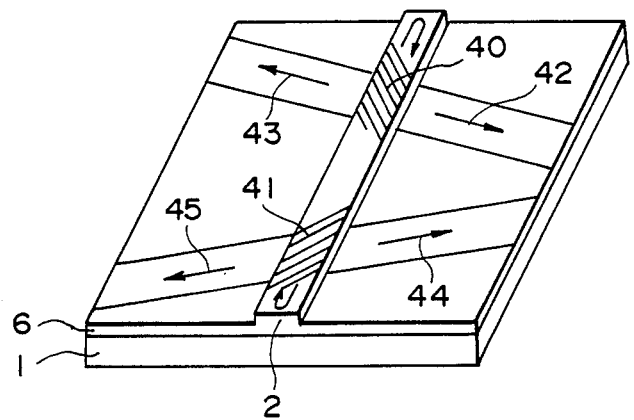
FIGS. 9, 10 and 11 are schematic perspective views showing third, fourth, and fifth embodiments of the present invention, respectively.

FIG. 9 is a schematic perspective view of a third embodiment of the present invention.

This embodiment exemplifies a semiconductor laser wherein gratings 40 and 41 having different tilt angles are formed with respect to a channel waveguide path 2 to obtain a plurality of slab waveguide beams 42, 43, 44, and 45 having different output angles. In this embodiment, the gratings have different tilt angles with respect to the channel waveguide path 2. However, the gratings 40 may have identical tilt angles with respect to the channel waveguide path 2.

(Fourth Embodiment)

Figure 10:
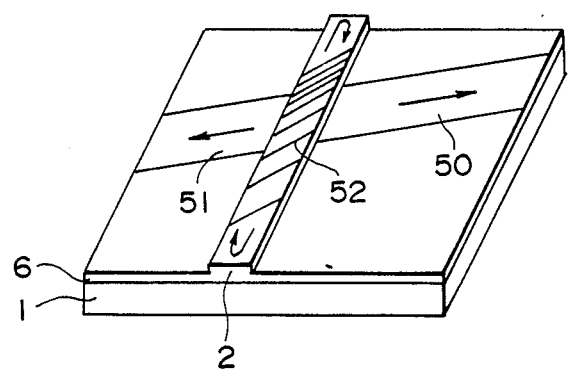

FIG. 10 is a schematic perspective view showing a fourth embodiment of the present invention. In the third embodiment, since the gratings 40 and 41 have uniform periods although their tilt angles are different, changes in wavelength of the oscillated laser beam and its propagation constants do not always satisfy the Bragg condition. For this reason, the optical output is often abruptly decreased. In addition, period errors and tilt angle errors of the gratings 40 and 41 result in degradation of the device performance. In the fourth embodiment, a chirp grating 52 having a gradually changing period is used to cope with a change in oscillation state of the laser and manufacturing errors of the gratings. The beam wave in the channel waveguide path is diffracted in only a grating region which satisfies the Bragg condition, thereby obtaining slab waveguide beams 50 and 51.

(Fifth Embodiment)

Figure 11:
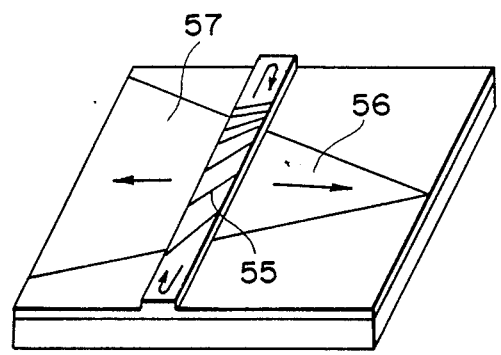

FIG. 11 is a schematic perspective view showing a fifth embodiment of the present invention. In this embodiment, since the period and tilt angle of a grating 55 are not uniform, a converged beam 56 of one channel waveguide beam and a divergent beam 57 of the other channel waveguide beam are obtained. In other words, the grating 55 serves as a kind of lens, and the period and tilt angle of the grating can be obtained from a focal point of the lens.

(Sixth Embodiment)

Figure 12A:
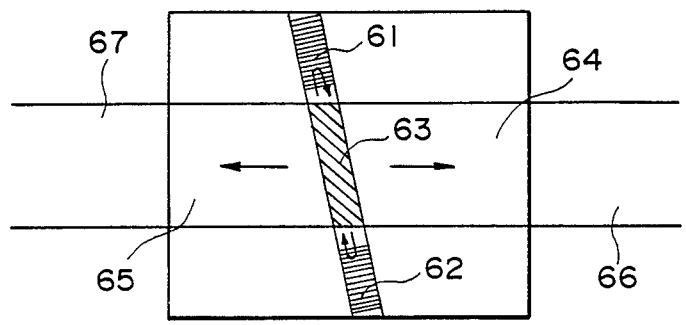
FIGS. 12A and 12B are plan views, respectively, showing a sixth embodiment of the present invention.

FIG. 12A is a schematic plan view showing a sixth embodiment of the present invention. This embodiment exemplifies a DBR (Distributed Bragg Reflection) laser structure using gratings 61 and 62 as laser resonator mirrors. In the previous embodiments, incident angles of the laser beams at the end faces 20 and 21 (perpendicular to the laser resonator mirror surfaces when the general cleavage end faces are used) of both sides of the slab waveguide path in FIG. 3 correspond to the polarization output angle $\theta$ determined by the Bragg condition. An air-side beam output has a larger angle upon an increase in incident angle in accordance with the Snell laws of refraction. When an incident angle exceeds a total reflection angle, the output beam is not extracted as an air-side output beam because the channel waveguide path has a high refractive index. According to this embodiment, since the crystal cleavage surface is not used as a resonant surface, the tilt angle of the laser resonator (channel waveguide path) with respect to the crystal axis can be arbitrarily selected. In this manner, when the laser resonator is tilted with respect to the crystal axis, the output beams 64 and 65 can always be extracted in a direction perpendicular to the end faces 20 and 21.

Figure 12B:
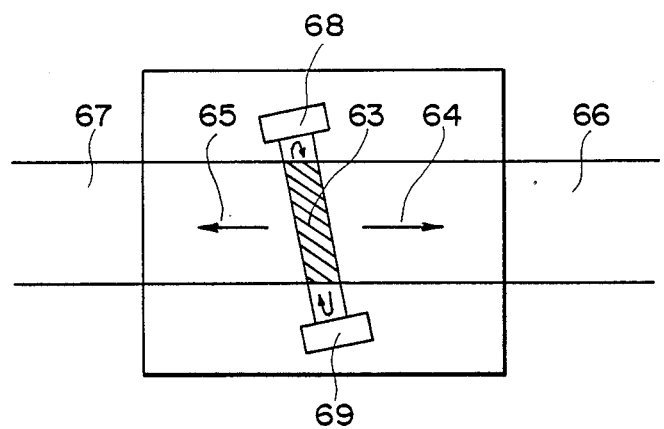

As shown in FIG. 12B, end faces 68 and 69 formed by etching the semiconductor may be used in place of the DBR structure constituted by the gratings 61 and 62 to obtain the same effect as described above.

(Seventh Embodiment)

Figure 13:
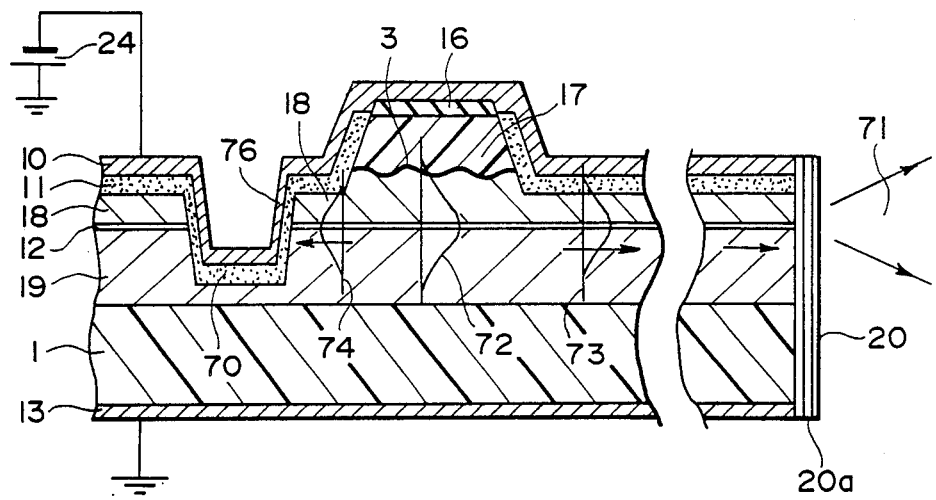
FIGS. 13 and 14 are a schematic sectional view and a schematic perspective view, respectively, showing a seventh embodiment of the present invention.
Figure 14:
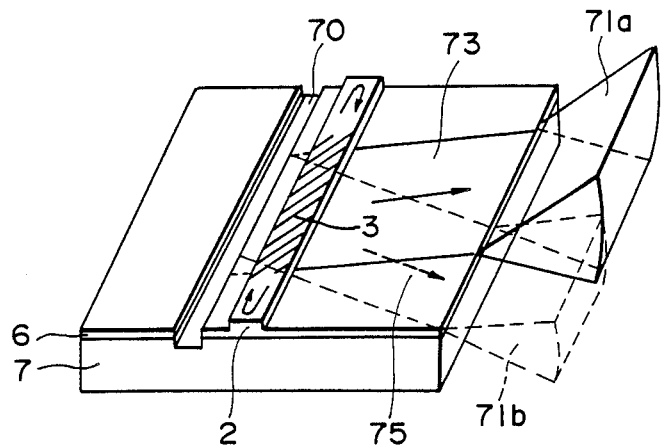

FIGS. 13 and 14 are a schematic sectional view and a schematic perspective view, respectively, showing a seventh embodiment of the present invention.

In this embodiment, slab waveguide beams are output from one end face. A groove 70 for terminating the slab waveguide beams is formed in one slab waveguide path. The groove 70 is formed by etching an epitaxial film such that the bottom of the groove 70 is located below an active layer 12. Referring to FIGS. 13 and 14, a beam wave 73 diffracted to the right is output without any change and is output from an end face 20 having a dielectric multilayer 21a. However, a beam wave 74 diffracted to the left is reflected to the right by an etched surface 76 which defines the groove 70, and becomes a beam wave 75. The diffracted beam waves 73 and 75 serve as linear light sources and are output as output beams 71a and 71b, generally, having different output angles.

The beam wave 75 reflected by the etched end face 76 does not satisfy the Bragg condition unless it is directly reflected. Therefore, the beam wave 75 will not be coupled to the channel waveguide path 2 by the grating 3. However, the two beam waves having different output angles are not often desirable. In this case, the etched end face 76 of the groove 70 is not constituted by a vertical surface but a tilt surface to provide a phase error to the beam wave 75, thereby decreasing the reflectance. Most of the beam wave is then scattered toward the substrate and becomes a loss. Alternatively, the tilt angle of the groove 70 is adjusted such that the beam wave 74 which is diffracted to the left is incident on the etched end face 76 of the groove 70 by direct reflection and is superposed on the beam wave 73 which is diffracted to the right. In order to match the phase of the beam wave 73 with that of the beam wave 75, the tilt angle (within the substrate) and position (reciprocal phase difference) of the groove 70 with respect to the laser resonator must be set with high precision.

In the above embodiment, the end face is formed by etching. However, the end face may be formed by cleavage.

(Eighth Embodiment)

Figure 1:
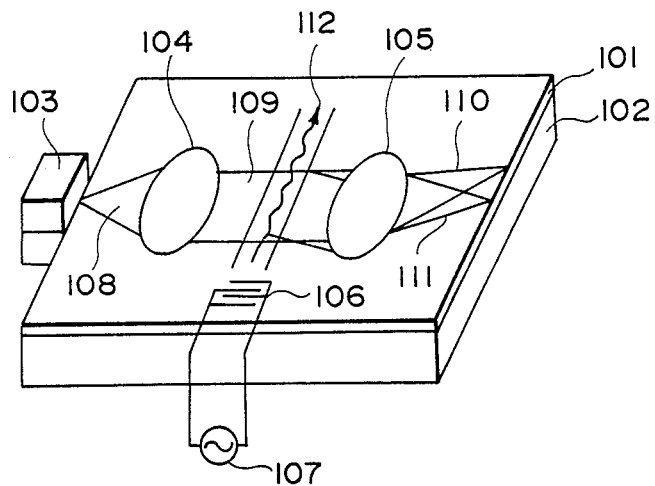
FIG. 1 is a schematic perspective view showing an arrangement of a conventional spectrum analyzer.
Figure 2:
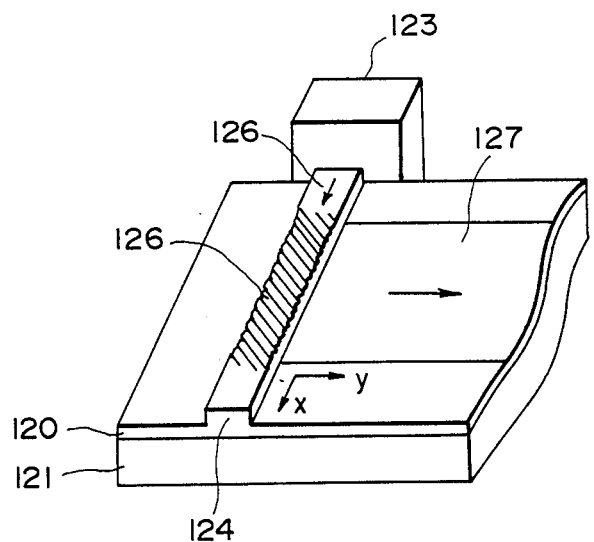
FIG. 2 is a schematic perspective view showing a conventional means for producing a collimated beam.
Figure 15:
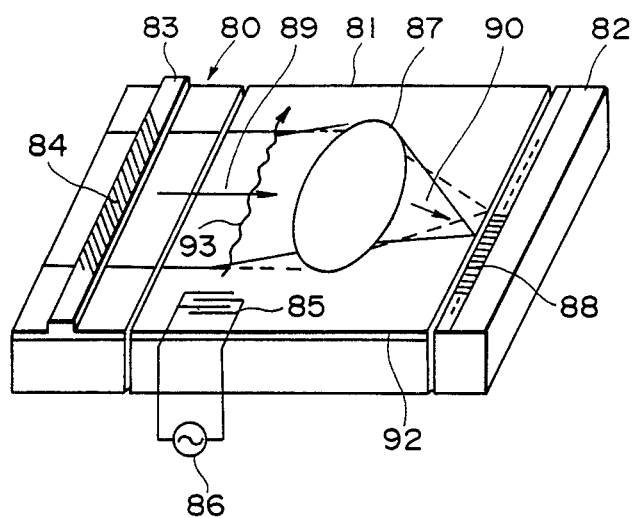
FIG. 15 is a schematic perspective view showing an eighth embodiment of the present invention.

FIG. 15 is a schematic perspective view of an eighth embodiment of the present invention, showing a compact arrangement of the conventional spectrum analyzer shown in FIG. 1.

The basic structure of this embodiment is constituted by a substrate 81 consisting of a piezoelectric material such as LiNbO$_3$ and a photodetector substrate 82. A collimated incident beam wave 89 from a laser source 80 having a channel waveguide path 83 and a grating coupler 84 as in the first embodiment is end-face coupled to an LiNbO$_3$ waveguide path 92 in which Ti is diffused. The wave 89 is diffracted by an elastic surface wave 93 excited by an interdigital electrode 85. A beam wave 90 which is further Fourier-transformed by a waveguide path lens 87 appears as a spectral distribution corresponding to the applied RF frequency at the waveguide path end face. The spectral distribution is converted into an electrical signal by a photodetector array 88 and is extracted as the electrical signal. According to this embodiment, the collimating waveguide path lens required in the conventional arrangement (FIG. 1) can be omitted, and the length can be reduced into about ½. This arrangement is also advantageous in alignment of the respective substrates.

In the above embodiment, the laser structure is exemplified by a ridge structure. However, the present invention is also applicable to various stripe lasers such as an embedded laser.

When the slab waveguide beams are output almost perpendicularly to the channel waveguide beams, the oscillating direction of the electric field overlaps the propagation direction in the laser TE mode. Therefore, it is expected to greatly reduce deflection efficiency. In this case, the present invention is applicable if a temperature change is controlled such that the laser oscillation occurs not in the TE mode but in the TM mode. The present invention includes all these applications without departing from the scope of the appended claims.

According to the present invention as has been described in detail, since the grating is formed inside the resonator of a stripe laser, the laser source can efficiently couple part of the channel waveguide beam as the laser oscillated beam and the slab waveguide beam in the channel waveguide path. Uniform in-phase slab waveguide beams having a high intensity distribution can be output. According to the present invention, the grating has a uniform period and the slab waveguide beams are extracted from the end faces. Therefore, a linear laser which is suitable for an optical integrated circuit can be provided without using a collimating means. In addition, since various types of gratings are formed in the laser, various types of slab waveguide beams can be produced. Therefore, design flexibility of the output beams in a semiconductor laser which is conventionally restricted by a resonator structure can be greatly improved.

What is claimed is:

1. A laser light source comprising:

a substrate;

a layered structure which is formed on said substrate and includes a light emitting layer;

a channel waveguide path which is provided at one part of said layered structure in a surface parallel to a surface of said substrate and which propagates light emitted from said light emitting layer;

a slab waveguide path provided at a part, in said layered structure, other than that where said channel waveguide path is provided;

reflecting means which is provided at both ends in a longitudinal direction of said channel waveguide path and which generates a laser oscillation by reflecting the propagated light; and means for extracting a laser light generated by said laser oscillation as a light collimated in one direction from said channel waveguide path to said slab waveguide path.

2. A laser light source according to claim 1, wherein said laser beam extracting means comprises a grating formed in said channel waveguide path such that grating lines are non-zero and non-right angles with respect to a longitudinal direction of said channel waveguide path.

3. A laser light source according to claim 2, wherein said slab waveguide path is provided at both sides of said channel waveguide path in a widthwise direction thereof, the beams which propagate along said channel waveguide path in opposite directions being extracted to said one slab waveguide path provided at one side of said channel waveguide and said other slab waveguide path provided at the other side of said channel waveguide path, respectively.

4. A laser light source according to claim 3, wherein said one slab waveguide path has means for preventing the beam extracted from said channel wave guide path from outputting from an end face thereof.

5. A laser light source according to claim 4, wherein said output preventing means is a groove formed in said one slab waveguide path.

6. A laser light source according to claim 2, wherein said grating includes a plurality of gratings having different tilt angles.

7. A laser light source according to claim 3, wherein said grating comprises a chirp grating whose grating period is gradually changed.

8. A laser light source according to claim 2, wherein said grating has a lens effect for converging or diverging the beam extracted into said slab waveguide path.

9. A laser light source according to claim 1, wherein a dielectric multilayered film for antireflection is formed on an end face of said slab waveguide path, the beam extracted from said channel waveguide path being externally output from said end face.

10. A laser light source according to claim 1, further including a grating, formed in a part of said slab waveguide path, for outputting the beam extracted from said channel waveguide path from an upper surface of said slab waveguide path.

11. A laser light source according to claim 10, further including a reflecting layer formed between said slab waveguide path and said substrate.

12. A laser-light source according to claim 1, wherein said channel waveguide path comprises a stripe-like projection formed on said substrate.

13. A laser light source according to claim 1, wherein said reflecting means comprises a mirror surface provided at each end in the longitudinal direction of said channel waveguide path.

14. A laser light source according to claim 13, wherein each said mirror surface is coated by a reflecting film.

15. A laser light source according to claim 1, wherein said reflecting means comprises a grating constituting a distributed Bragg reflection structure.

16. A semiconductor laser comprising:
   a substrate;
   a layered structure which includes at least a semiconductor active layer emitting light by injecting a current, said layered structure being formed on said substrate;
   a pair of electrodes for applying a current to said active layer;
   a channel waveguide path which is provided at one part of said layered structure in a surface parallel to a surface of said substrate and which propagates the light emitted from said active layer;
   a slab waveguide path provided at a part, in said layered structure, other than that where said channel waveguide path is provided;
   reflecting means which is provided at each end in a longitudinal direction of said channel waveguide path and which generates a laser oscillation by reflecting the propagated light; and
   a grating photocoupler for extracting a laser light generated by said laser oscillation as a light collimated in one direction, from said channel waveguide path to said slab 17. A laser according to claim 16, wherein said slab waveguide path is provided at both sides of said channel waveguide path in a widthwise direction thereof, the beams which propagate along said channel waveguide path in opposite directions being coupled to said one slab waveguide path provided at one side of said channel waveguide path and said other slab waveguide path provided at the other side of said channel waveguide path, respectively.

18. A laser according to claim 16, wherein said one slab waveguide path has means for preventing the beam coupled from said channel waveguide path from outputting from an end face thereof.

19. A laser according to claim 18, wherein said output preventing means is a groove formed in said one slab waveguide path.

20. A laser according to claim 16, wherein said grating photocoupler includes a plurality of gratings having different tilt angles.

21. A laser according to claim 16, wherein said grating photocoupler comprises a chirp grating whose grating period is gradually changed.

22. A laser according to claim 16, wherein said grating photocoupler has a lens effect for converging or diverging the beam coupled to said slab waveguide path.

23. A laser according to claim 16, wherein a dielectric multilayered film for antireflection is formed on an end face of said slab waveguide path, the beam coupled from said channel waveguide path being externally output from said end face.

24. A laser according to claim 16, further including a grating, formed in a part of said slab waveguide path, for outputting the beam extracted from said channel waveguide path from an upper surface of said slab waveguide path.

25. A laser according to claim 24, further including a reflecting layer formed between said slab waveguide path and said substrate.

26. A laser according to claim 16, wherein said channel waveguide path comprises a stripe-like projection formed on said substrate.

27. A semiconductor laser according to claim 16, wherein said reflecting means comprises a mirror surface provided at each of said ends in the longitudinal direction of said channel waveguide path.

28. A semiconductor laser according to claim 27 wherein each said mirror surface is coated by a reflecting film.

29. A semiconductor laser according to claim 27 wherein said reflecting means comprises a grating constituting a distributed Bragg reflection structure.

30. An optical integrated circuit comprising:
   a first substrate;
   a layered structure which is formed on said first substrate and includes a light emitting layer;
   a channel waveguide path which is provided at one part of said layered structure in a surface parallel to a surface of said first substrate and which propagates light emitted from said light emitting layer;
   a first slab waveguide path provided at a part, in said layered structure, other than that where said channel waveguide path is provided;
   reflecting means which is provided at each end in a longitudinal direction of said channel waveguide path and which generates a laser oscillation by reflecting the propagated light;
   means for extracting a laser light generated by said laser oscillation as a light collimated in one direction, from said channel waveguide path to said first slab waveguide path;
   a second substrate comprising a piezoelectric material;
   a second slab waveguide path which is formed on said second substrate and to which a light from said first slab waveguide path is connected; and
   means for generating an elastic surface wave for deflecting a light propagated in said second slab waveguide path.

31. A circuit according to claim 30, further including a thin film lens for focusing the beam deflected by the elastic surface wave.

32. A circuit according to claim 31, further including a photodetector array for receiving the beam focused by said thin film lens.

33. A circuit according to claim 30, wherein said means for extracting the laser beam from said channel waveguide path comprises a grating formed in said channel waveguide path such that grating lines are non-zero and non-right angles with respect to a longitudinal direction of said channel waveguide path.

34. A circuit according to claim 30, wherein said channel waveguide path comprises a stripe-like projection formed on said first substrate.

* * * * *

UNITED STATES PATENT AND TRADEMARK OFFICE
CERTIFICATE OF CORRECTION

PATENT NO. : 4,935,930
DATED : June 19, 1990
INVENTOR(S) : YUICHI HANDA

It is certified that error appears in the above-identified patent and that said Letters Patent is hereby corrected as shown below:

COLUMN 3

Line 28, "diverged" should read --are diverged--.
    Line 35, "device The" should read --device. The--.

COLUMN 4

Line 12, "$\beta_F$ and $\beta_B$," should read --/$\beta_F$ and /$\beta_B$,--.
    Line 14, "/$\beta_F$ and /$\beta_B$," should read --$\beta_F$ and $\beta_B$,--.
    Line 38, "$\Lambda = \lambda/2N \sin \theta/2 = 0.309$ μm)" should read --$\Lambda = \lambda/2N \sin \theta/2 = 0.309$ μm--.

COLUMN 8

Line 36, "wave guide" should read --waveguide--.
    Line 64, "laser-light" should read --laser light--.

UNITED STATES PATENT AND TRADEMARK OFFICE
CERTIFICATE OF CORRECTION

PATENT NO. : 4,935,930

DATED : June 19, 1990

INVENTOR(S) : YUICHI HANDA

It is certified that error appears in the above-identified patent and that said Letters Patent is hereby corrected as shown below:

COLUMN 9

```
Line 32, "slab" should read
         --slab channel waveguide path.--.
Line 42, "claim 16," should read --claim 17,--.
```

Signed and Sealed this

Nineteenth Day of January, 1993

*Attest:*

DOUGLAS B. COMER

*Attesting Officer*     Acting Commissioner of Patents and Trademarks